US012412836B2

(12) United States Patent
Xie et al.

(10) Patent No.: US 12,412,836 B2
(45) Date of Patent: Sep. 9, 2025

(54) BACKSIDE POWER PLANE

(71) Applicant: INTERNATIONAL BUSINESS MACHINES CORPORATION, Armonk, NY (US)

(72) Inventors: Ruilong Xie, Niskayuna, NY (US); Nicholas Anthony Lanzillo, Wynantskill, NY (US); Hosadurga Shobha, Niskayuna, NY (US); Lawrence A. Clevenger, Saratoga Springs, NY (US); Huai Huang, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 541 days.

(21) Appl. No.: 17/662,870

(22) Filed: May 11, 2022

(65) Prior Publication Data

US 2023/0369219 A1 Nov. 16, 2023

(51) Int. Cl.
*H01L 23/528* (2006.01)
*H01L 21/768* (2006.01)
*H01L 23/522* (2006.01)
*H10D 30/67* (2025.01)
*H10D 84/01* (2025.01)
*H10D 84/03* (2025.01)
*H10D 62/10* (2025.01)

(52) U.S. Cl.
CPC .... *H01L 23/5286* (2013.01); *H01L 21/76897* (2013.01); *H01L 23/5226* (2013.01); *H10D 30/6757* (2025.01); *H10D 84/0149* (2025.01); *H10D 84/038* (2025.01); *H10D 62/121* (2025.01)

(58) Field of Classification Search
CPC ............ H01L 23/5286; H01L 23/5226; H01L 23/481
See application file for complete search history.

(56) References Cited

U.S. PATENT DOCUMENTS

| | | | |
|---|---|---|---|
| 9,741,691 B2 | 8/2017 | Lim | |
| 9,997,389 B2 | 6/2018 | Moslehi | |
| 10,586,765 B2 | 3/2020 | Smith | |
| 10,636,739 B2 | 4/2020 | Beyne | |
| 10,886,224 B2 | 1/2021 | Gerousis | |
| 11,121,086 B2 | 9/2021 | Hiblot | |
| 11,270,991 B1 | 3/2022 | Chava | |
| 2002/0020862 A1* | 2/2002 | Livengood | H01L 23/481 257/E21.597 |

(Continued)

OTHER PUBLICATIONS

Nigar et al., "High performance selective buried double gate power MOSFET", Semiconductor Science and Technology, 34(5), Mar. 2019, 7 pages.

(Continued)

*Primary Examiner* — Michele Fan
(74) *Attorney, Agent, or Firm* — Gavin Giraud

(57) ABSTRACT

Embodiments disclosed herein include a semiconductor structure. The semiconductor structure may include a first power plane electrically connected to a first plurality of via-to-backside power planes (VBPPs), a second power plane, and a plurality of pass through vias electrically connecting the second power plane to a second plurality of VBPPs, wherein the plurality of pass through vias pass through the first power plane.

14 Claims, 9 Drawing Sheets

(56) References Cited

U.S. PATENT DOCUMENTS

| | | | |
|---|---|---|---|
| 2005/0167782 A1* | 8/2005 | Sanchez | H01L 21/76838 |
| | | | 257/532 |
| 2016/0322331 A1 | 11/2016 | Lim | |
| 2018/0145030 A1 | 5/2018 | Beyne | |
| 2018/0218973 A1 | 8/2018 | Nelson | |
| 2020/0373242 A1 | 11/2020 | Hiblot | |
| 2021/0111115 A1 | 4/2021 | Patrick | |
| 2021/0202472 A1 | 7/2021 | Thomson | |
| 2022/0020666 A1 | 1/2022 | Van Dal | |
| 2022/0028758 A1 | 1/2022 | Song | |
| 2022/0068906 A1 | 3/2022 | Chava | |
| 2023/0095654 A1* | 3/2023 | Elsherbini | H01L 25/0657 |
| | | | 257/713 |

OTHER PUBLICATIONS

Smith, Jeffrey, "Design technology co-optimization approaches for integration and migration to CFET and 3D logic", Proceedings of the 2019 Surface Preparation and Cleaning Conference (SPCC), Portland, Oregon, Apr. 1-3, 2019, 30 pages.

* cited by examiner

BACKSIDE POWER PLANE

BACKGROUND

The present invention relates generally to the field of power delivery in a semiconductor structure, and more particularly to power planes to deliver voltage to individual transistor devices.

In fabricating semiconductor devices, millions of devices can be located together on a single substrate. Useful control of these millions of devices relies on the application of electrical signals to specific devices while insulting the electrical signals from shorting to anything else (e.g., other devices). Within standard logic cells, power rails in back-end of line (BEOL) metal layers deliver current to source/drains that power the individual devices (e.g., transistors). The power rails carry a higher current than standard routing tracks/signal lines to maintain adequate power distribution targets, and therefore require a larger space in the cell. In many designs, a power rail can be four times larger than a normal routing line, which can limit scaling for integrated circuits. As integrated circuits get denser and denser, the power delivery network can become a bottleneck in the circuit design. Power delivery networks are becoming highly resistive, contributing to increased IR loss, while a higher number of transistors and faster clock speeds are contributing to increased inductance loss.

SUMMARY

Aspects of an embodiment of the present invention include a semiconductor structure. The semiconductor structure may include a first power plane electrically connected to a first plurality of via-to-backside power planes (VBPPs), a second power plane, and a plurality of pass through vias electrically connecting the second power plane to a second plurality of VBPPs, wherein the plurality of pass through vias pass through the first power plane.

Aspects of an embodiment of the present invention include a method of fabricating a semiconductor structure. The method may include forming transistor devices of a first transistor type and a second transistor type on a substrate, forming a first via-to-backside power plane (VBPP) electrically connected to one of the transistor devices of the first transistor type, forming a second VBPP electrically connected to one of the transistor devices of the second transistor type, forming a first power plane electrically connected to the first VBPP and forming a second power plane.

Aspects of an embodiment of the present invention include a semiconductor structure. The semiconductor structure may include a first transistor device of a first semiconductor type, a second transistor device of a second semiconductor type, a first power plane electrically connected to the first transistor device, and a second power plane electrically connected to the second transistor device through the first power plane.

DETAILED DESCRIPTION

Figure 1:
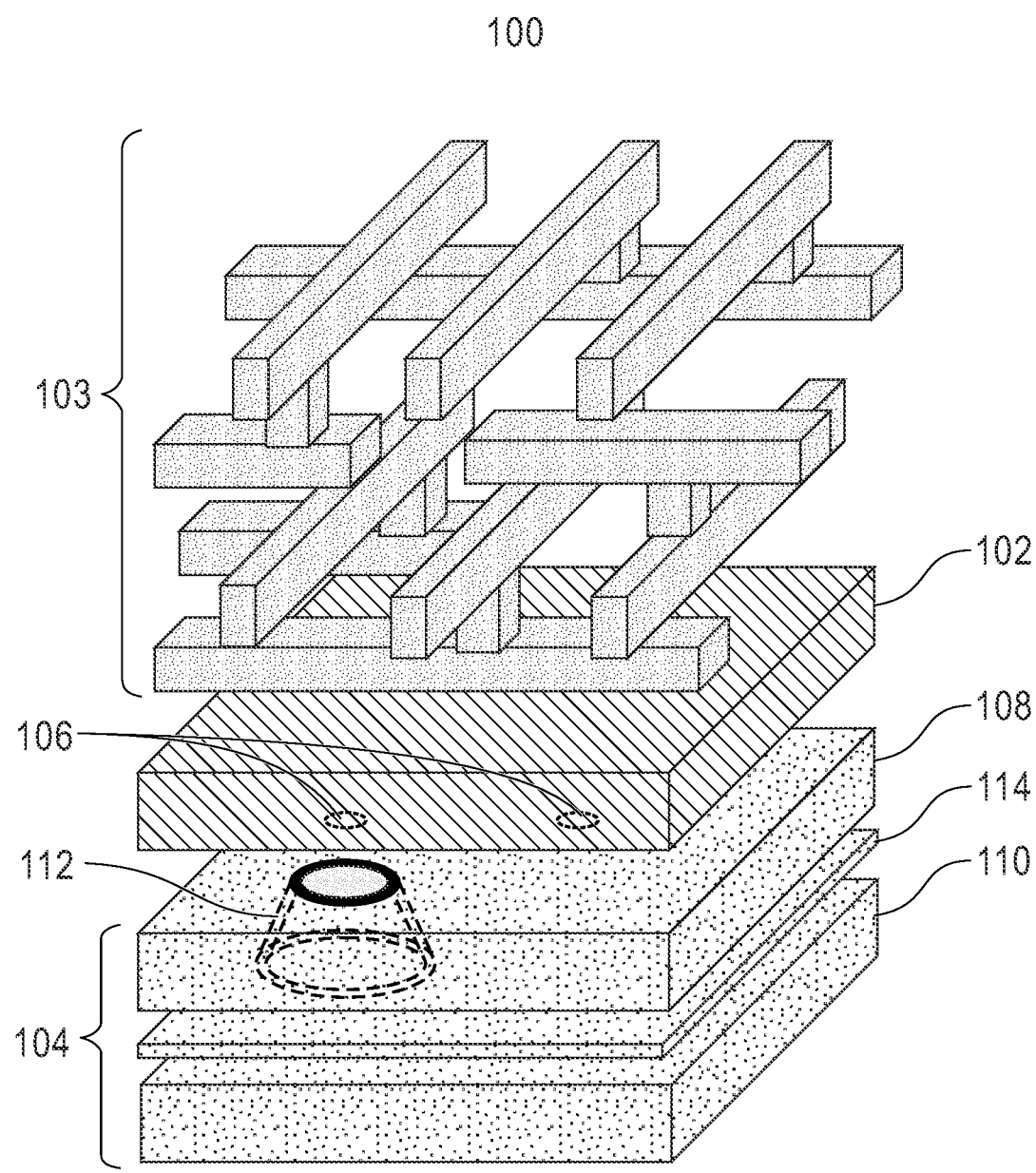
FIG. 1 depicts a schematic see-through perspective view of a semiconductor structure having a power plane, in accordance with one embodiment of the present invention.

In the following detailed description, reference is made to the accompanying drawings, which show specific examples of embodiments of the invention. These embodiments are described in sufficient detail to enable those skilled in the art to practice them, and it is to be understood that other embodiments may be utilized, and that structural, logical, and electrical changes may be made without departing from the described embodiments. The following detailed description is, therefore, not to be taken in a limiting sense, and the included embodiments are defined by the appended claims.

In the fabrication of power delivery networks, certain embodiments may include wires incorporated into the integrated circuit on a back side of the circuit, opposite the signal wires of the circuit. Separating the signal delivery from the power delivery enables more area within the circuit for each delivery system. Embodiments of backside power delivery networks may typically use a series of metal levels to deliver the power to each transistor device. The metal levels nearest to the transistor devices are the narrowest, with each additional metal layer increasing in size. Embodiments disclosed herein may also include power planes to deliver power to the transistor devices in an integrated circuit. The power planes may be stacked, with certain embodiments including a dielectric plane between power planes. The power planes may also include pass through vias to connect a higher plane (i.e., away from the transistor devices) to connect to buried power rails of the transistor devices.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

References in the specification to "one embodiment," "an embodiment," "certain embodiments," etc., indicate that the embodiment described may include a particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "right," "left," "vertical," "horizontal," "top," "bottom," and derivatives thereof shall relate to the disclosed structures and methods, as oriented in the drawing Figures. The terms "above," "below," "positioned on," or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present. Each reference number may refer to an item individually or collectively as a group. For example, a pass through via 112 may refer to a single pass through via 112 or multiple pass through vias 112.

The present invention will now be described in detail with reference to the Figures.

FIG. 1 depicts a schematic see-through perspective view of a semiconductor structure 100 having a device region 102, a back-end-of-line (BEOL) 103, and power delivery region 104 in accordance with one embodiment of the present invention. The device region 102 includes transistors and middle of line interconnects comprising contacts wiring transistor in the device region 102 to the BEOL 103, and contacts wiring the transistors in the device region 102 to backside power delivery region 104, and is not drawn to scale. The device region 102 may include separated NFET and PFET regions arranged in rows and columns containing thousands or millions of transistors. In certain embodiments, the device layer 102 is fabricated in one vertical orientation (and completed) before the semiconductor structure 100 is flipped over with the power delivery region 104 being fabricated in the opposite vertical orientation. The process of fabrication and flipping the semiconductor structure 100 is explained in detail below, but the device region 102 may be fabricated on a substrate, and may include via-to-backside power planes (VBPPs) 106 that are exposed to the power delivery region 104 after the substrate is removed. The VBPPs 106 contact one of two power planes that are fabricated as a vertical stack. A first power plane 108 is located directly contacting the device region 102, while a second power plane 110 is located vertically below (in the orientation of FIG. 1) the first power plane 108. The second power plane 110 contacts the VBPPs 106 through the use of pass through vias 112 that protrude through the first power plane 108 with an electrically conductive material.

The first power plane 108 may be insulated from the second power plane 110 by a dielectric plane 114 located between the first power plane 108 and the second power plane 110. The first power plane 108 and the second power plane 110 may be connected to voltage sources (not pictured) that supply a voltage meant for a subsection of transistor devices in a device region 102. For example, the first power plane 108 may be connected to a $V_{DD}$ voltage source while the second power plane 110 may be connected to a $V_{SS}$ voltage source.

Figure 2:
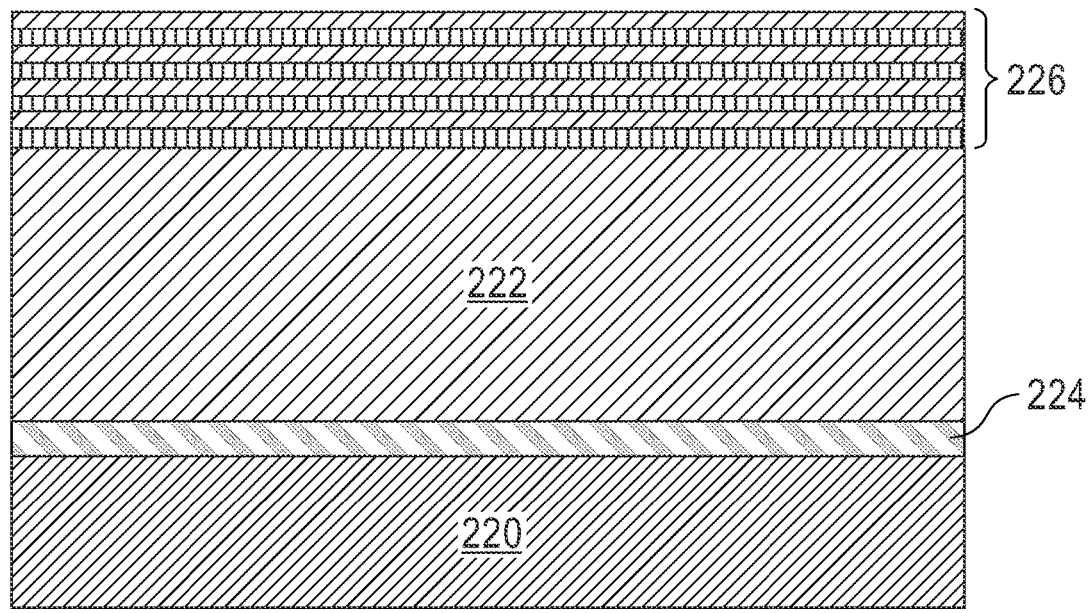
FIG. 2 depicts a schematic cross-sectional diagram of a semiconductor structure, in accordance with one embodiment of the present invention.

FIG. 2 is a schematic cross-sectional side view of a semiconductor structure 200 at a fabrication step, in accordance with one embodiment of the present invention. FIG. 2 is a view of the semiconductor structure 200 formed on a structural substrate 220 that is separated from a silicon substrate 222 by an etch stop layer 224. Above the silicon substrate 222, the semiconductor structure 200 includes nanosheet layers 226 that form the transistors. The nanosheet layers 226 may be fabricated by forming epitaxial semiconductor layers sequentially above the bottom-most semiconductor layer above the silicon substrate 222. For example, a layer of silicon and a layer of BOX SiO2 may be fabricated above the silicon substrate 222. Then the layers may be converted into alternating SiGe and Si layers by growing a SiGe layer through a condensation process to convert the bottom most semiconductor layer above the silicon substrate 222 to SiGe. After that, the oxide above the SiGe is removed, followed by alternative layers of Si and SiGe layer growth. Other methods may be used to form the nanosheet layers 226. Certain embodiments may also include other forms of transistors.

Figure 3:
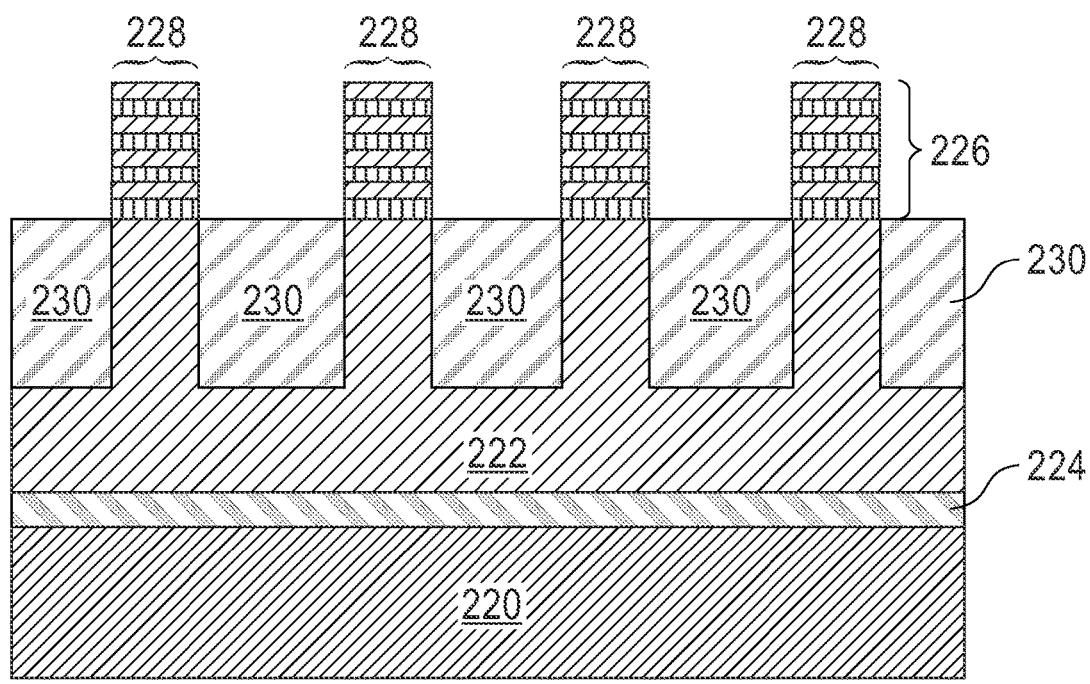
FIG. 3 depicts a schematic cross-sectional diagram of the semiconductor structure of FIG. 2, in accordance with one embodiment of the present invention.

FIG. 3 is a schematic cross-sectional side view of the semiconductor structure 200 of FIG. 2 at a fabrication step, in accordance with one embodiment of the present invention. FIG. 3 is a view of the semiconductor structure 200 after a hard mask (not pictured) is deposited and patterned to form fins 228. A patterning process is applied to the hard mask to define the active regions by conventional lithographical and etch processes. Then the area of the nanosheet layers 226 that are not protected by the hard mask may be etched away to form the fins 228. The open spaces between the fins 228 may be filled with shallow trench isolation (STI) 230, which may be etched back to reveal the fins 228. Certain embodiments may be fabricated by depositing the STI 230 only in the open spaces below the nanosheet layers 226.

Figure 4:
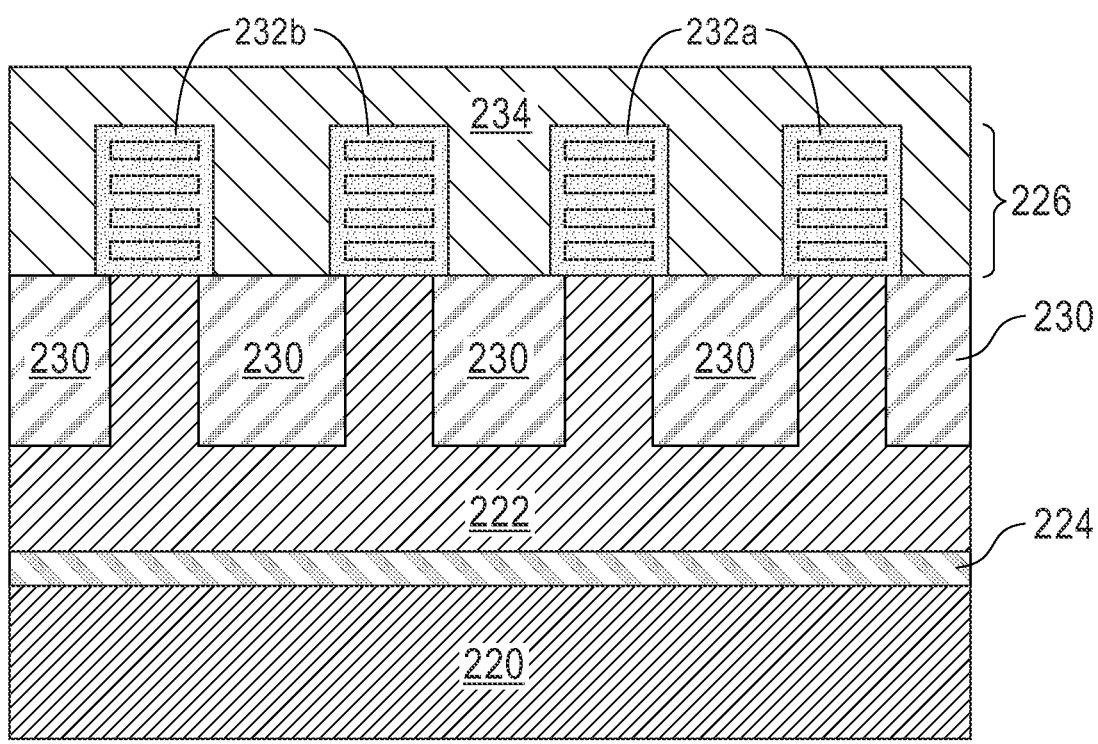
FIG. 4 depicts a schematic cross-sectional diagram of the semiconductor structure of FIG. 2, in accordance with one embodiment of the present invention.

FIG. 4 is a schematic cross-sectional side view of the semiconductor structure 200 of FIG. 2 at a fabrication step, in accordance with one embodiment of the present invention. FIG. 4 is a view of the semiconductor structure 200 after front-end-of-line (FEOL) transistors 232a, b are fabricated. The FEOL transistors 232a, b may be fabricated with source/drains and gates using conventional transistor fabrication methods. The FEOL transistors 232a, b may include a specified semiconductor type, such as NFET or PFET. For example, the two right-most transistors 232a may be of an PFET type of semiconductor while the two left-most transistors 232b may be of a NFET type of semiconductor. Though not illustrated, the FEOL transistors 232a, b may be laterally cut in a direction perpendicular to the illustrated direction such that the semiconductor structure 200 may include several fins 228 along a column (i.e., into and out of the page). The open spaces between the FEOL transistors 232a, b may then be filled with dielectric 234, such as a non-crystalline solid material such as SiN, SiC, SiCN(H), or other silicon compounds for insulating, silicon dioxide (SiO2) undoped silicate glass (USG), tetraethyl orthosilicate (TEOS), low-K dielectric, or ultra low-K dielectric materials, fluorosilicate glass (FSG), borophosphosilicate glass (BPSG), a spin-on low-K dielectric layer, a chemical vapor deposition (CVD) low-K dielectric layer or any combination thereof. The semiconductor structure 200 may then be planarized, for example with chemical-mechanical planarization (CMP).

Figure 5:
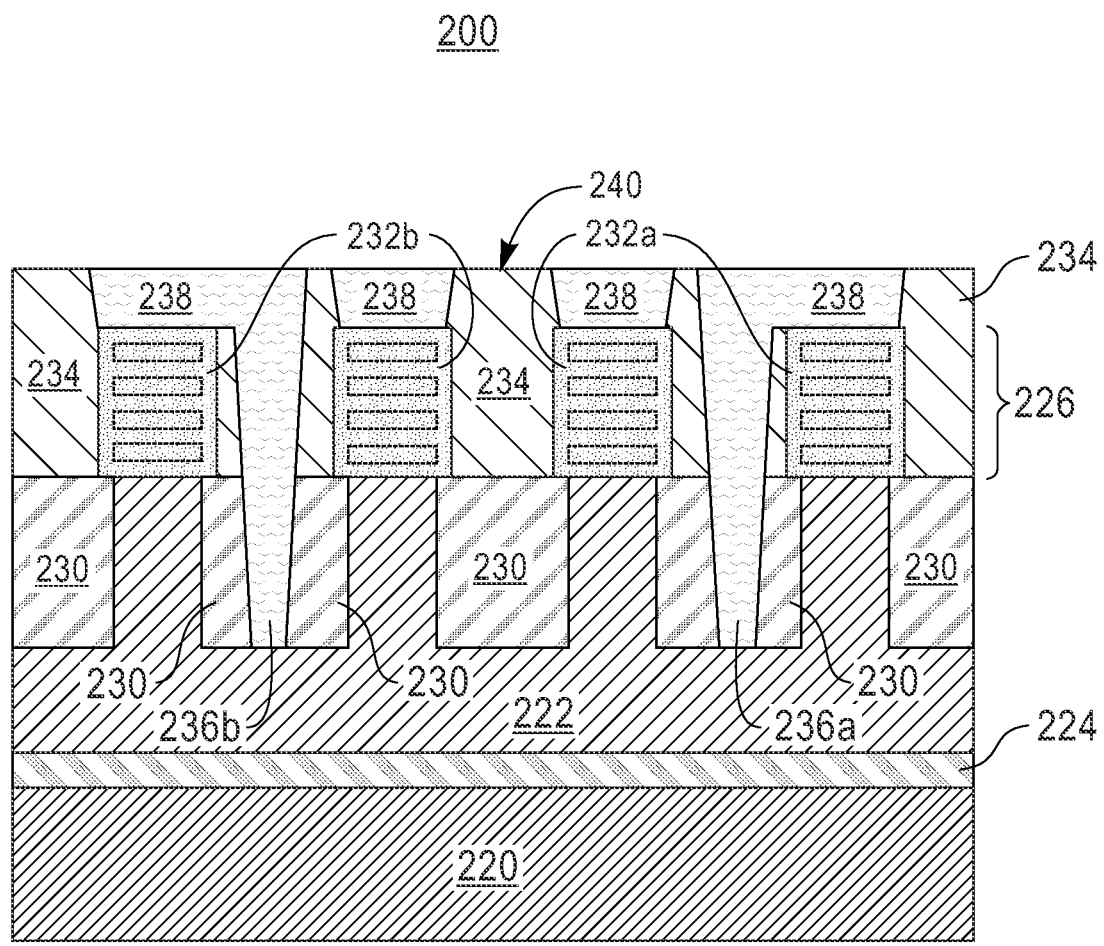
FIG. 5 depicts a schematic cross-sectional diagram of the semiconductor structure of FIG. 2, in accordance with one embodiment of the present invention.

FIG. 5 is a schematic cross-sectional side view of the semiconductor structure 200 of FIG. 2 at a subsequent fabrication stage, in accordance with one embodiment of the present invention. FIG. 5 shows via-to-backside power planes (VBPPs) 236a, b and contacts 238 that are formed from a top side 240 of the semiconductor structure 200 by etching the dielectric 234 and filling the etched spaces with conductive material. The VBPPs 236a, b and the contacts 238 may be patterned using a conventional lithographical and etch process, and may be patterned using one hard mask (not illustrated) for the VBPPs 236a, b and another hard mask (not illustrated) for the contacts 238. Each hard mask may be patterned (e.g., using lithography and etch processes) so that the VBPPs 236a, b may be subsequently formed through an etching process. In some embodiments, this etching can be performed using an anisotropic etch such as reactive ion etching (RIE). The VBPPs 236a, b may be etched through the dielectric 234, the STI 230, and in certain embodiments may partially cut into the silicon substrate 222. The VBPPs 236a, b do not require a large width (i.e., a width large enough to reduce the resistance below a threshold). A narrower VBPP 236a, b helps protect the FEOL transistors 232 from being damaged by the VBPP patterning process, even at worst case lithographic misalignment. The first VBPP 236a may be formed between a pair of transistors 232 that have a same semiconductor type. For example, the first VBPP 236a may be formed between the PFET transistors 232a while the second VBPP 236b may be formed between the NFET transistors 232b.

Figure 6:
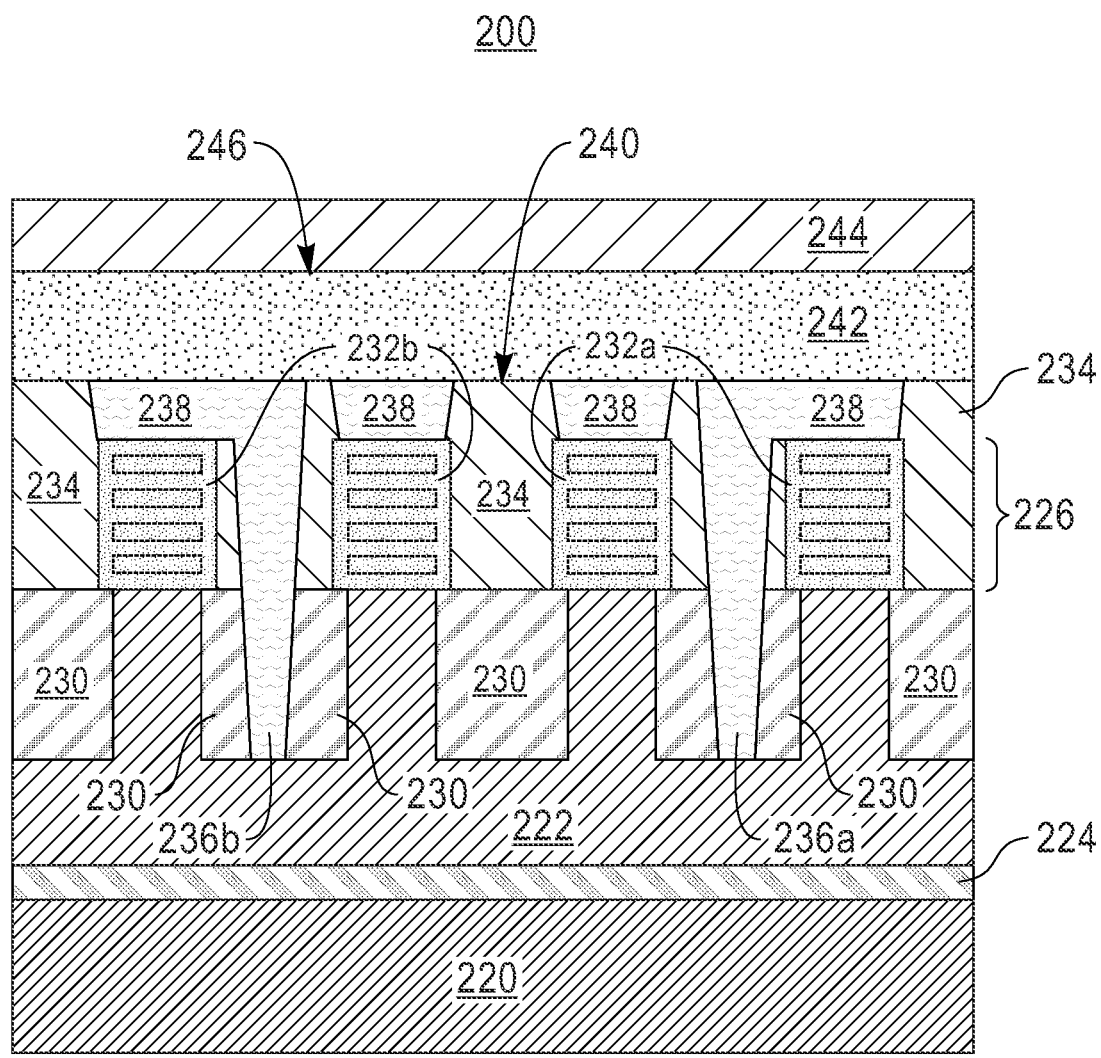
FIG. 6 depicts a schematic cross-sectional diagram of the semiconductor structure of FIG. 2, in accordance with one embodiment of the present invention.

FIG. 6 is a schematic cross-sectional side view of the semiconductor structure 200 of FIG. 2, in accordance with one embodiment of the present invention. FIG. 6 shows additional of middle-of-line (MOL) and/or back-end-of-line (BEOL) layers 242 and a carrier wafer 244 bonded to a top surface 246 of the MOL/BEOL layers 242. The MOL/BEOL layers 242 include the signal wires for controlling the transistors 232 through the contacts 238; the signal wires may also control a subset of the contacts 238. That is, some of the contacts 238 may be connected to a power delivery network (e.g., the power delivery region 104 shown in FIG. 1) and not be connected to the MOL/BEOL layers 240 for signal processing.

The MOL/BEOL layers 240 include contacts, insulating layers (dielectrics), metal levels, and bonding sites for chip-to-package connections. While the illustrated embodiment is not drawn to scale, modern processes for fabricating the MOL/BEOL layers 240 may include more than ten metal layers. The carrier wafer 242 is bonded to enable the wafer flip and backside processing, including the steps illustrated below. In certain embodiments, the carrier wafer 242 may be bonded to the MOL/BEOL layers 240 through dielectric-dielectric bonding or Cu—Cu bonding.

Figure 7:
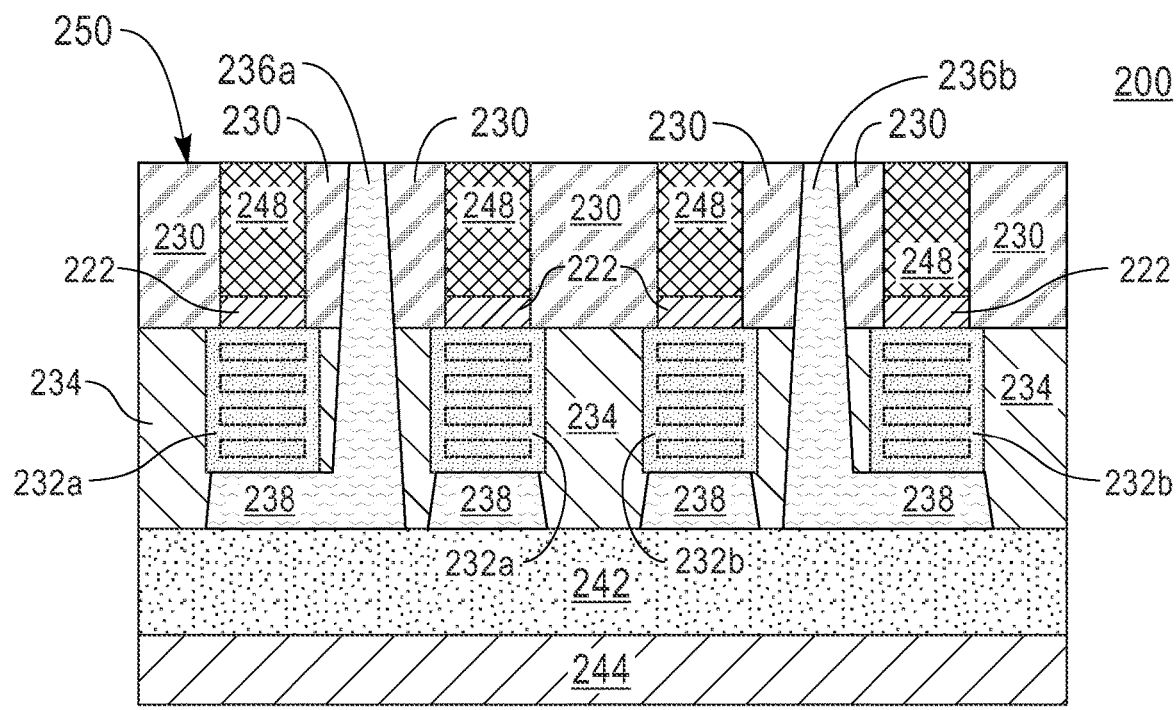
FIG. 7 depicts a schematic cross-sectional diagram of the semiconductor structure of FIG. 2, in accordance with one embodiment of the present invention.

FIG. 7 is a schematic cross-sectional side view of the semiconductor structure 200 of FIG. 2, in accordance with one embodiment of the present invention. FIG. 7 shows the semiconductor structure 200 flipped over to complete the steps for power delivery. The carrier wafer 244 supports the semiconductor structure 200 while the structural substrate 220 and the etch stop layer 224 are removed. The etch stop layer 224 is included so that the structural substrate 220 can be removed with a rough grinding or etch method that might otherwise damage portions of the silicon substrate 222 or the VBPPs 236a, b. After the structural substrate 220 and the etch stop layer 224 are removed, the silicon substrate 222 may be recessed and replaced by a dielectric fill 248. The dielectric fill 248 insulates the transistors 232a, b from the power delivery network that will be fabricated on a top 250 (as oriented in FIG. 7) of the dielectric fill 248 and the STI 230.

Figure 8:
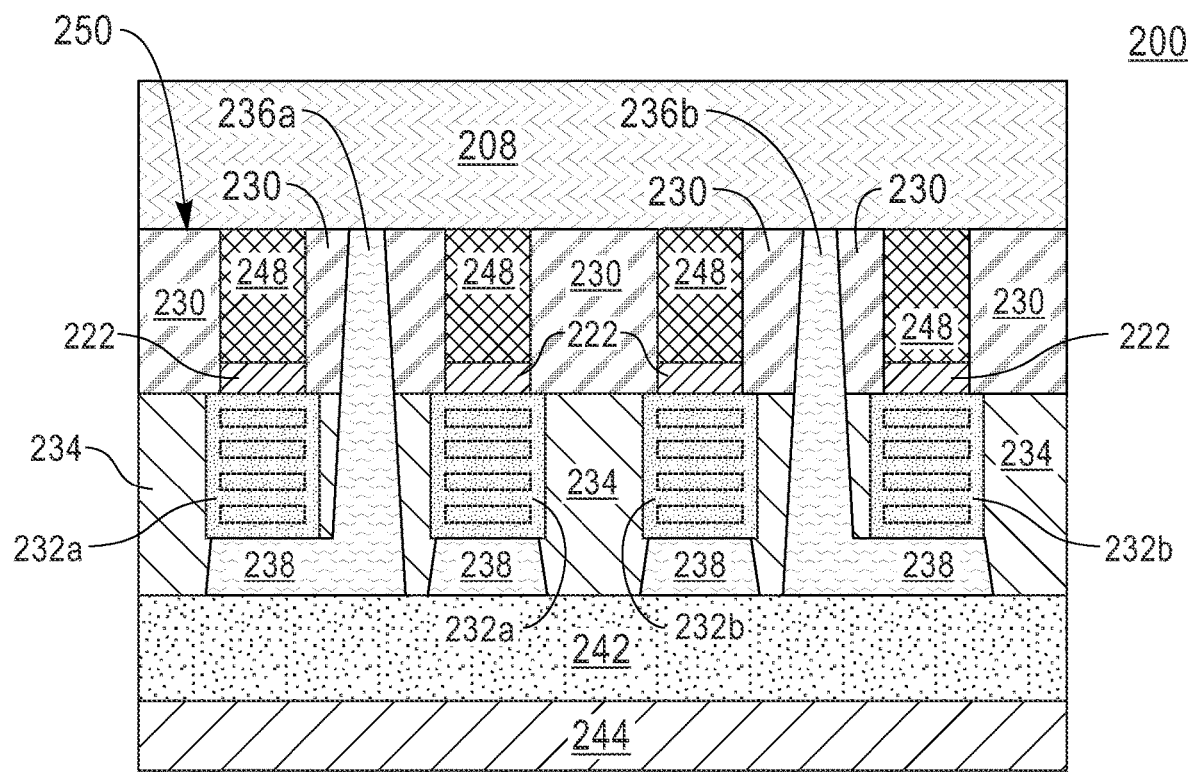
FIG. 8 depicts a schematic cross-sectional diagram of the semiconductor structure of FIG. 2, in accordance with one embodiment of the present invention.

FIG. 8 is a schematic cross-sectional side view of the semiconductor structure 200 of FIG. 2, in accordance with one embodiment of the present invention. FIG. 8 shows the semiconductor structure 200 with a first power plane 208 formed on the top 250 of the dielectric fill 248 and the STI 230. The first power plane 208 is formed as a blanket layer from an electrically conductive material such as metal or thin tantalum nitride and ruthenium. After formation, the first power plane 208 contacts the VBPPs 236a, b at the top 250. This contact with the VBPPs 236a, b enables an electrical signal to travel through the first power plane 208 and the VBPPs 236a, b to the transistors 232a, b. The increased cross-section of the first power plane 208 provides a lower resistance for the power signals that are conveyed to the transistors 232a, b. Specifically, the first power plane 208 provides a lower resistance when compared to metal levels of wires and vias that are typically used in power delivery networks. The first power plane 208 may be patterned and etched from portions of the wafer that do not require a backside power delivery network. For example, the wafer may include portions that do not have transistors 232a, b.

Figure 9:
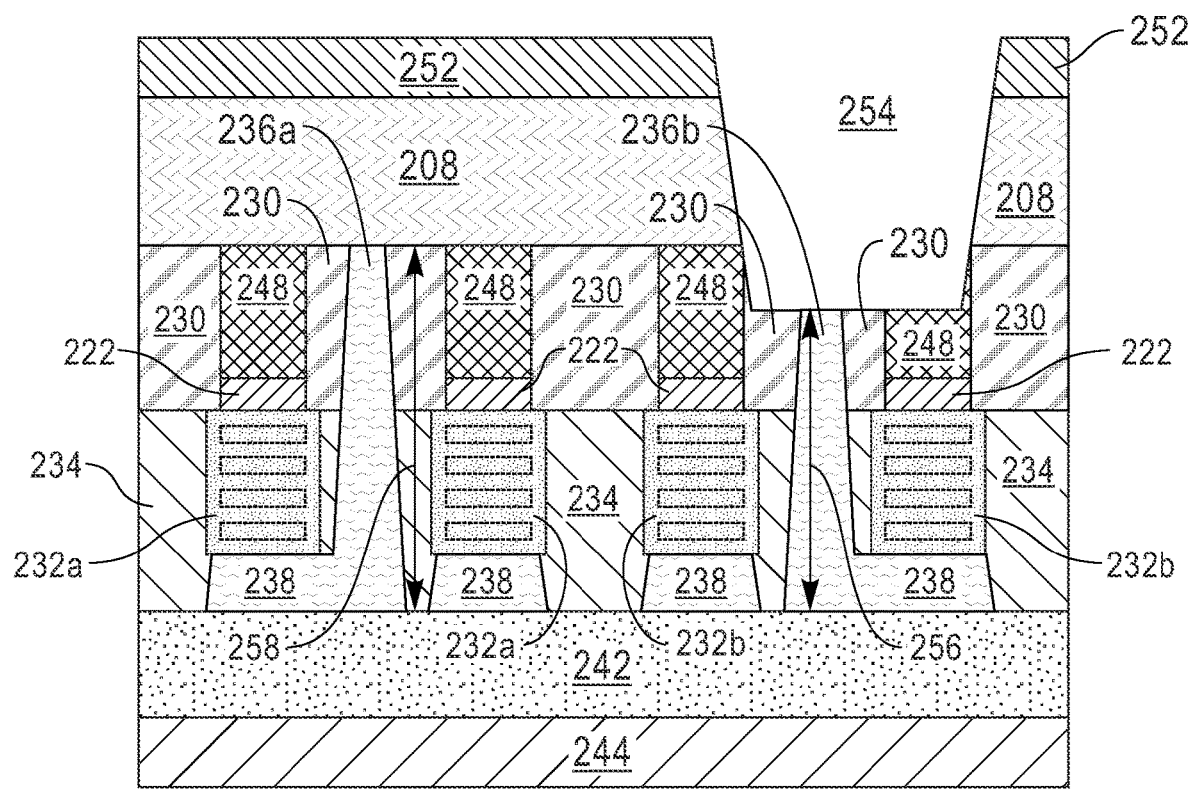
FIG. 9 depicts a schematic cross-sectional diagram of the semiconductor structure of FIG. 2, in accordance with one embodiment of the present invention.

FIG. 9 is a schematic cross-sectional side view of the semiconductor structure 200 of FIG. 2, in accordance with one embodiment of the present invention. FIG. 9 shows the semiconductor structure 200 with a dielectric plate 252 formed above the first power plane 208. The dielectric plate 252 is formed from a high-K material; for example a material with a κ value of 7 or greater. The dielectric plate 252 insulates the first power plane 208 from additional conductive materials formed above the dielectric plate 252. FIG. 9 also shows patterning resulting in a pass through via hole 254. The pass through via hole 254 is etched through the dielectric plate 252, the first power plane 208, and through portions of the STI 230, dielectric fill 248, and the second VBPP 236b. Certain embodiments may avoid etching the second VBPP 236b, but reducing a height 256 of the second VBPP 236b can decrease the likelihood of shorting between the second VBPP 236b and the first power plane 208. The first VBPP 236a includes an unchanged height 258 that maintains the electrical connection between the first VBPP 236a and the first power plane 208.

Figure 10:
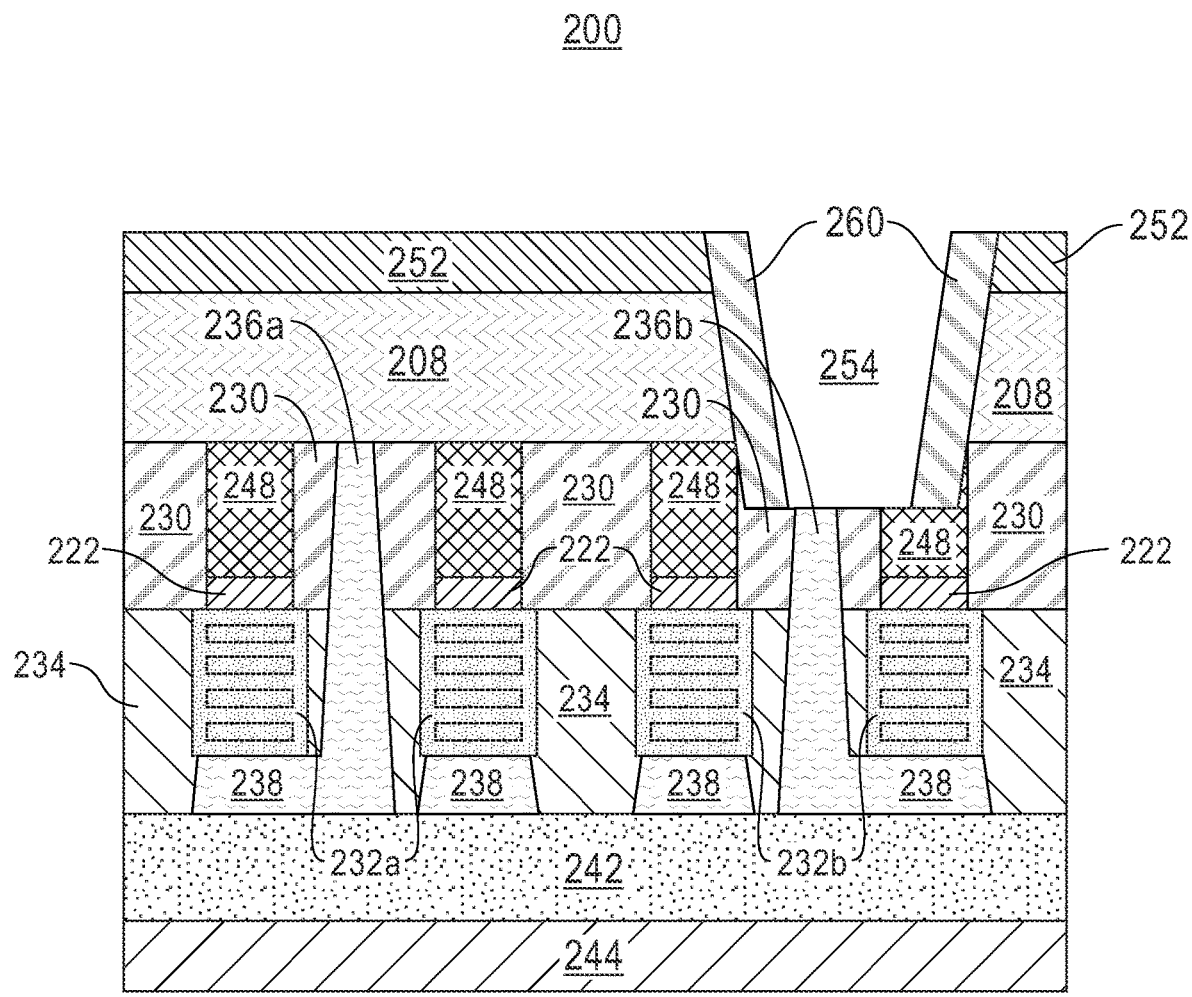
FIG. 10 depicts a schematic cross-sectional diagram of the semiconductor structure of FIG. 2, in accordance with one embodiment of the present invention.

FIG. 10 is a schematic cross-sectional side view of the semiconductor structure 200 of FIG. 2, in accordance with one embodiment of the present invention. FIG. 10 shows the semiconductor structure 200 with a spacer 260 that lines the lateral sides of the pass through via hole 254. The spacer 260 is formed of a dielectric material that insulates the first power plane 208 from the pass through via hole 254. The spacer 260 does not cover the second VBPP 236b.

Figure 11:
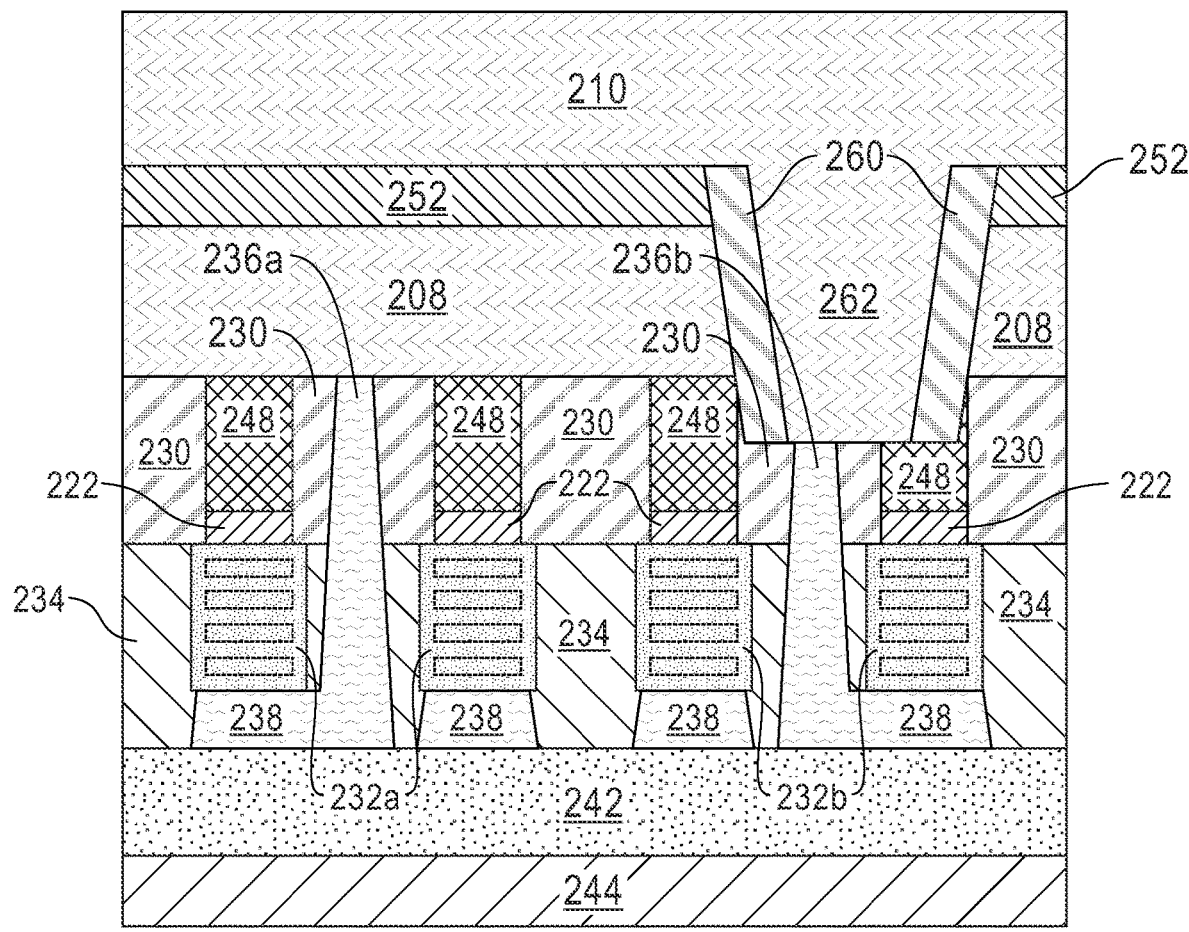
FIG. 11 depicts a schematic cross-sectional diagram of the semiconductor structure of FIG. 2, in accordance with one embodiment of the present invention.

FIG. 11 is a schematic cross-sectional side view of the semiconductor structure 200 of FIG. 2, in accordance with one embodiment of the present invention. FIG. 11 shows the semiconductor structure 200 with a second power plane 210 and a pass through via 262 formed within the pass through via hole 254. The pass through via 262 and the second power plane 210 may be formed concurrently from the same material. For example, after the spacer 260 is formed, a metal may be formed in the pass through via hole 254 and built up on top of the dielectric plate 252 to form the second power plane 210. The second power plane 210 may then be polished to the desired thickness.

In certain embodiments of the invention, additional power planes may be formed to provide additional options for power voltage to different transistors. In certain embodiment (including the illustrated embodiment) two voltages are sufficient: a $V_{DD}$ voltage applied to one power plane (e.g., the first power plane 208) for application to the PFET transistors 236a, and a $V_{SS}$ voltage applied to the other power plane (e.g., the second power plane 210) for application to the NFET transistors 236b. By patterning and etching a pass through via 262 only over the second VBPPs 236b connecting to second transistors 232b, only the second transistors 232b will receive the voltage signal of the second power plane 210, and the first transistors 232a (i.e., that do not have a pass through via 262 formed above them) will receive the voltage signal from the first power plane 208.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure, comprising:
    a first power plane electrically connected to a first plurality of entirely metalized via-to-backside power planes (VBPPs) each comprising a horizontal portion directly connected to one transistor of a plurality of first transistors;
    a second power plane; and
    a plurality of pass through vias electrically connecting the second power plane to a second plurality of entirely metalized VBPPs, wherein the plurality of pass through vias pass through the first power plane and each VBPP comprises a horizontal portion directly connected to one transistor of a plurality of second transistors.

2. The semiconductor structure of claim 1, further comprising a dielectric plane between the first power plane and the second power plane.

3. The semiconductor structure of claim 2, wherein the first power plane contacts a first side of the dielectric plane and the second power plane contacts a second side of the dielectric plane.

4. The semiconductor structure of claim 1, further comprising a spacer between the pass through via and the first power plane.

5. The semiconductor structure of claim 1, wherein the first power plane is configured to supply a $V_{DD}$ signal and the second power plane is configured to supply a $V_{SS}$ signal.

6. The semiconductor structure of claim 1, wherein the first plurality of VBPPs comprise a first height, the second plurality of VBPPs comprise a second height that is less than the first height.

7. The semiconductor structure of claim 1, further comprising:
    a first transistor device comprising a first type of semiconductor connected to one of the first plurality of VBPPs; and
    a second transistor device comprising a second type of semiconductor different from the first type of semiconductor connected to one of the second plurality of VBPPs.

8. A semiconductor structure, comprising:
    a first transistor device of a first semiconductor type;
    a second transistor device of a second semiconductor type;
    a first power plane electrically connected to the first transistor device by a first entirely metalized via-to-backside power plane (VBPP), wherein the first VBPP is directly connected to the first power plane and comprises a horizontal portion directly connected to the first transistor; and
    a second power plane electrically connected to the second transistor device by a second entirely metalized VBPP directly connected to a pass through via that passes through the first power plane and comprises a horizontal portion directly connected to the second transistor.

9. The semiconductor structure of claim 8, further comprising a spacer between the pass through via and the first power plane.

10. The semiconductor structure of claim 8, further comprising a dielectric plane between the first power plane and the second power plane.

11. The semiconductor structure of claim 10, wherein the first power plane contacts a first side of the dielectric plane and the second power plane contacts a second side of the dielectric plane.

12. The semiconductor structure of claim 8, wherein the first power plane and the second power plane are formed on a backside of the semiconductor structure.

13. The semiconductor structure of claim 8, wherein the first power plane is configured to supply a $V_{DD}$ signal and the second power plane is configured to supply a $V_{SS}$ signal.

14. The semiconductor structure of claim 8,
    wherein the first VBPP comprises a first height and
    the second VBPP comprises a second height that is less than the first height.

* * * * *